(12) United States Patent
Uno et al.

(10) Patent No.: US 7,741,176 B2
(45) Date of Patent: Jun. 22, 2010

(54) METHOD FOR FABRICATING A CYLINDRICAL CAPACITOR INCLUDING IMPLANTING IMPURITIES INTO THE UPPER SECTIONS OF THE LOWER ELECTRODE TO PREVENT THE FORMATION OF HEMISPHERICAL GRAIN SILICON ON THE UPPER SECTIONS

(75) Inventors: Tomohiro Uno, Tokyo (JP); Yoshitaka Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 61 days.

(21) Appl. No.: 12/013,509

(22) Filed: Jan. 14, 2008

(65) Prior Publication Data

US 2008/0173980 A1    Jul. 24, 2008

(30) Foreign Application Priority Data

Jan. 15, 2007    (JP)    ............................. 2007-005944

(51) Int. Cl.
*H01L 21/8242*    (2006.01)
*H01L 27/108*    (2006.01)

(52) U.S. Cl. ....................... 438/255; 438/390; 438/398; 257/E21.013

(58) Field of Classification Search ................. 438/253, 438/255, 396, 398, 390; 257/E21.013, E21.014
See application file for complete search history.

(56) References Cited

U.S. PATENT DOCUMENTS 6,159,785 A * 12/2000 Tsuchimoto et al. ........ 438/238
6,385,020 B1 * 5/2002 Shin et al. ..................... 361/15
6,916,723 B2 * 7/2005 Chen et al. .................. 438/399
2007/0210365 A1* 9/2007 Togashi et al. .............. 257/296

FOREIGN PATENT DOCUMENTS

| JP | 2001-510945 A | 8/2001 |
| JP | 2005-191534 A | 7/2005 |
| WO | WO 99/04434 A2 | 1/1999 |

* cited by examiner

*Primary Examiner*—Anh D Mai
(74) *Attorney, Agent, or Firm*—Sughrue Mion, PLLC

(57) ABSTRACT

A method for fabricating a semiconductor device is disclosed. The semiconductor device includes a capacitor and a support insulator. The capacitor includes a cylindrical electrode. The cylindrical electrode comprises upper and lower sections. The lower section has a roughened inner surface and an outer surface supported by the support insulator. The upper section upwardly projects from the support insulator. An initial cylindrical electrode is formed, wherein the initial cylindrical electrode comprises an initial upper section and an initial lower section which correspond to the upper section and the lower section of the cylindrical electrode, respectively. The initial upper section is supported by the support insulator. Specific impurities are implanted into the initial upper section, wherein the specific impurities serve to prevent the initial upper section from being roughened. Then, the initial cylindrical electrode is exposed to a roughening process so that the initial lower section is roughened to be the lower section.

4 Claims, 10 Drawing Sheets

METHOD FOR FABRICATING A CYLINDRICAL CAPACITOR INCLUDING IMPLANTING IMPURITIES INTO THE UPPER SECTIONS OF THE LOWER ELECTRODE TO PREVENT THE FORMATION OF HEMISPHERICAL GRAIN SILICON ON THE UPPER SECTIONS

BACKGROUND OF THE INVENTION

This invention relates to a semiconductor device with a capacitor and to a method for fabricating the semiconductor device.

A semiconductor device such as a dynamic random access memory (DRAM) comprises a capacitor which is required to be downsized but to have a larger capacitance. One of the techniques meeting the foregoing requirements is disclosed in WO 99/04434, which is incorporated herein by reference. However, the disclosed capacitor has a problem in its structural strength. Therefore, there is a need for a semiconductor device that has a capacitor with high structural strength, and a need for a fabrication method of the semiconductor device.

SUMMARY OF THE INVENTION

One aspect of the present invention provides a method for fabricating a semiconductor device, wherein: the semiconductor device includes a capacitor and a support insulator; the capacitor includes a cylindrical electrode; the cylindrical electrode comprises upper and lower sections; the lower section has a roughened inner surface and an outer surface supported by the support insulator; and the upper section upwardly projects from the support insulator. An initial cylindrical electrode is formed, wherein the initial cylindrical electrode comprises an initial upper section and an initial lower section which correspond to the upper section and the lower section of the cylindrical electrode, respectively. The initial upper section is supported by the support insulator. Specific impurities are implanted into the initial upper section, wherein the specific impurities serve to prevent the initial upper section from being roughened. Then, the initial cylindrical electrode is exposed to a roughening process so that the initial lower section is roughened to be the lower section.

An appreciation of the objectives of the present invention and a more complete understanding of its structure may be had by studying the following description of the preferred embodiment and by referring to the accompanying drawings.

Figure 1:
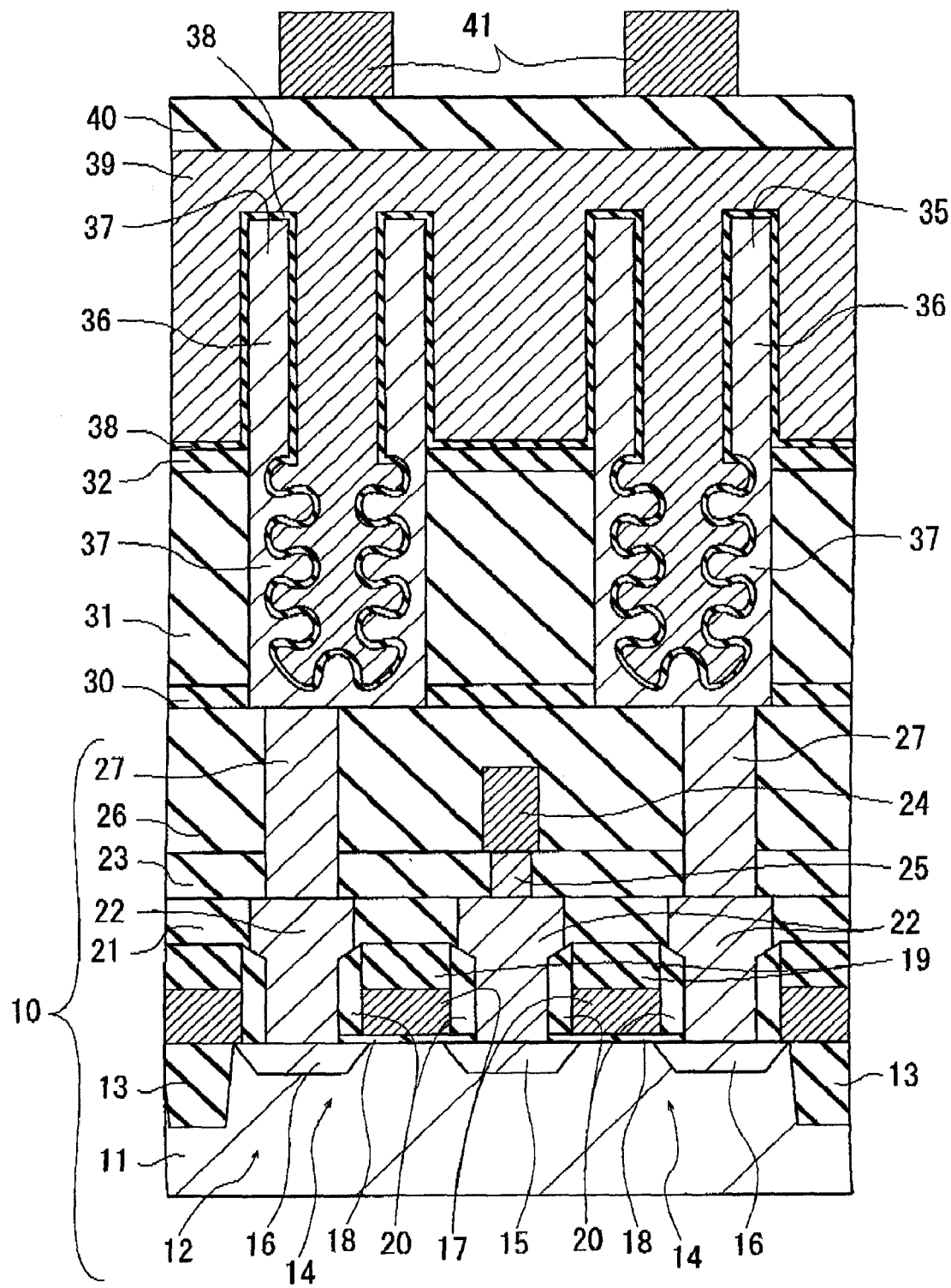
FIG. 1 is a cross-sectional view schematically showing a part of a semiconductor device in accordance with an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

A semiconductor device of an embodiment of the present invention is a DRAM that has storage capacitors, as shown in FIG. 1. However, the present invention is not limited thereto but may be applied to another semiconductor device. Hereinafter, explanation will be made about a fabrication method of the semiconductor device.

As illustrated in FIG. 1, a substrate with a lower layer 10 is prepared. In detail, the lower layer 10 comprises a silicon substrate 11, which is divided into a plurality of element-formation regions 12 by element-separation regions 13. The illustrated element-separation regions 13 are of buried-in type. On each of the element-formation regions 12, transistors 14 are formed. In detail, impurities are doped in the element-formation region 12 sot that drain regions 15 and source regions 16 are formed. Between one of the drain regions 15 and one of the source regions 16, a gate electrode 17 is formed on the element-formation region 12 with a gate insulator film 18 placed between the gate electrode 17 and the element-formation region 12. Each gate electrode 17 extends over a plurality of the element-formation regions 12 along a direction perpendicular to the drawing sheet. Each gate electrode 17 serves as a word line. Each of the illustrated transistors 14 further comprises a cover insulator 19 and sidewall insulators 20; the cover insulator is formed on the gate electrode 17 to cover the upper surface of the gate electrode 17; the sidewall insulators 20 cover the side surfaces of the gate electrode 17, respectively. On the transistors 14 and the silicon substrate 11, an insulator layer 21 is formed. In the insulator layer 21, a plurality of contact plugs 22 are formed. Each of the contact plugs 22 is positioned on and is connected to the drain region 15 or the source region 16. On the insulator layer 21, another insulator layer 23 is formed. On the insulator layer 23, a plurality of bit lines 24 are formed. In the insulator layer 23, a plurality of contact plugs 25 are formed to electrically connect the bit lines 24 to the drain regions 15 through the contact plugs 22, respectively. On the insulator layer 23, yet another insulator layer 26 is formed. In the insulator layer 23 and the insulator layer 26, a plurality of contact plugs 27 are further formed to be connected to the source regions 16 through the contact plugs 22, respectively.

Figure 2:
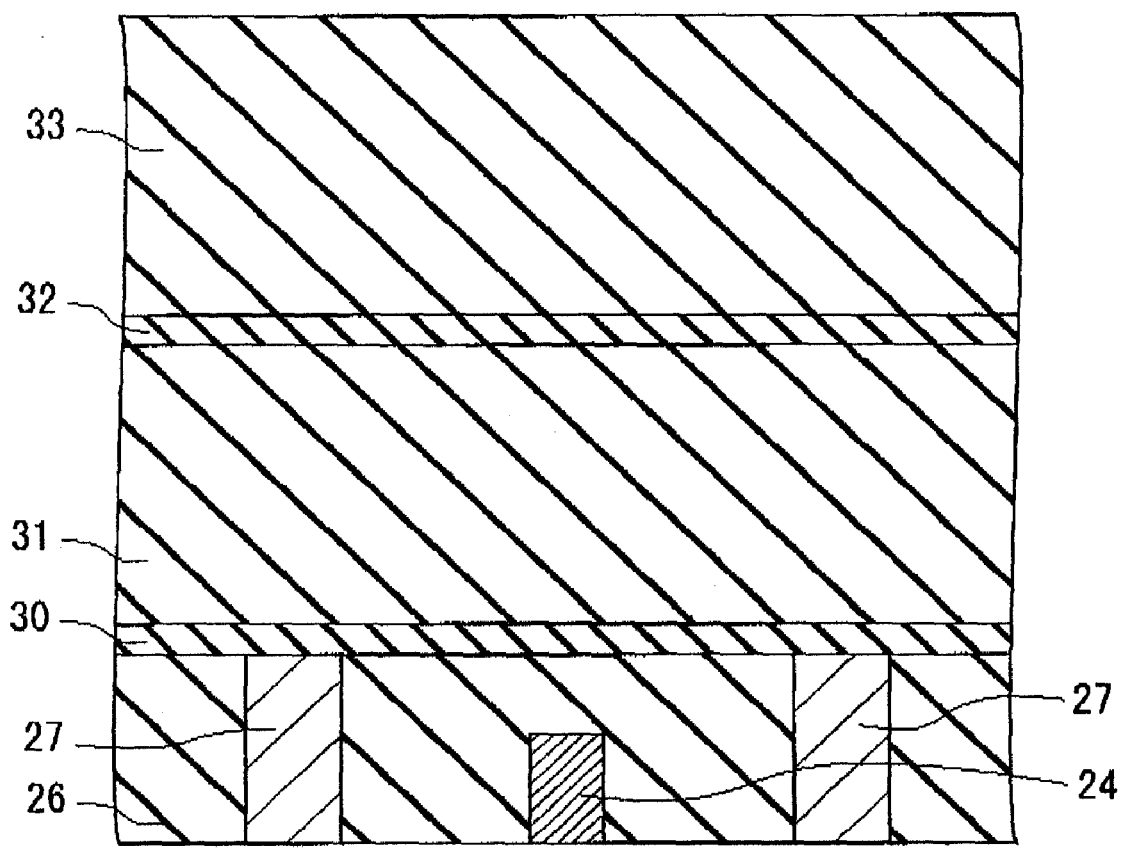
FIG. 2 is a cross-sectional view schematically showing a fabrication process for the semiconductor device of FIG. 1.

After the preparation of the substrate with the lower layer 10, a silicon nitride (SiN) film 30, an insulator film 31, another silicon nitride (SiN) film 32 and another insulator film 33 are formed in turn on the insulator layer 26, as shown in FIG. 2. In this embodiment, the silicon nitride (SiN) film 30, the insulator film 31, the silicon nitride (SiN) film 32 and the insulator film 33 are formed through a plasma chemical vapor deposition (PCVD) method. Each of the illustrated silicon nitride film 30 and the silicon nitride film 32 has a thickness of 50 nm. Each of the illustrated insulator film 31 and the illustrated insulator film 33 is made of non-doped silicate glass (NSG) and has a thickness of 1.5 μm.

Figure 3:
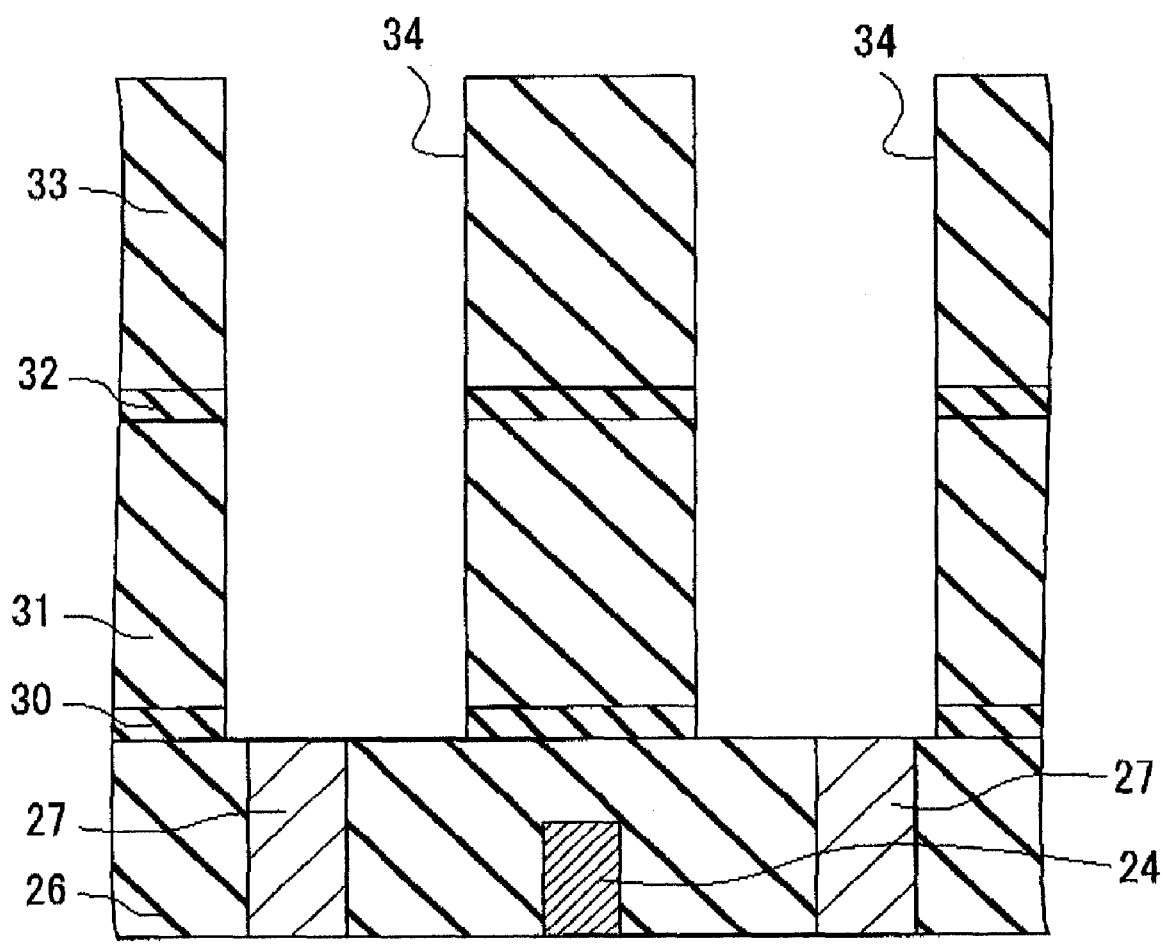
FIG. 3 is a cross-sectional view schematically showing a subsequent fabrication process for the semiconductor device of FIG. 1.

With reference to FIG. 3, the silicon nitride film 30, the insulator film 31, the silicon nitride film 32 and the insulator film 33 are etched to form a plurality of holes 34 therein. Each of the holes 34 extends along a vertical direction and pierces the silicon nitride film 30, the insulator film 31, the silicon nitride film 32 and the insulator film 33 to reach one of the contact plugs 27.

Figure 4:
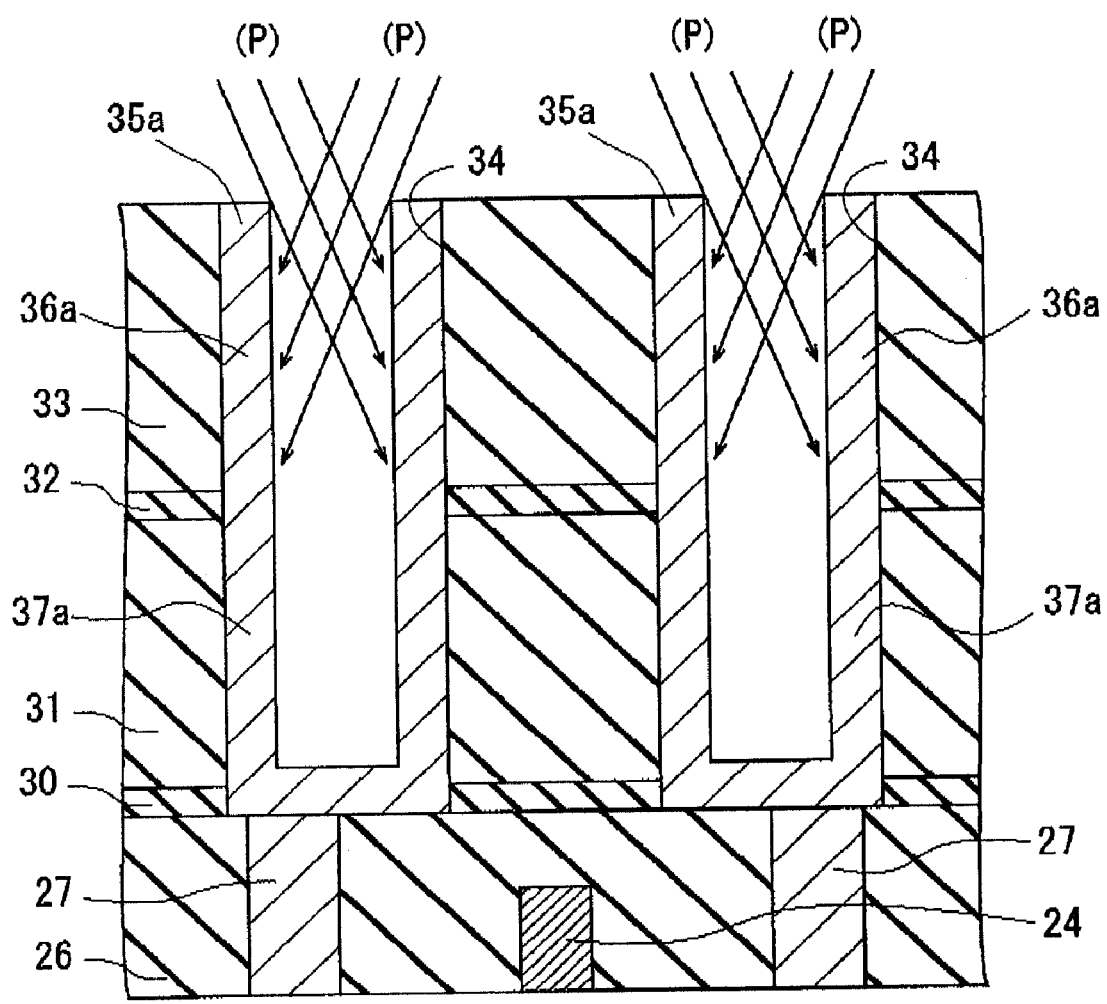
FIG. 4 is a cross-sectional view schematically showing a subsequent fabrication process for the semiconductor device of FIG. 1.

Next, an amorphous silicon film is formed thereover to have a thickness of 20 nm. The temperature condition upon the film formation is 550C.° or less. Then, its excess parts on the insulator film 33 are removed so that initial cylindrical electrodes 35a are formed on the inner surfaces of the holes 34, respectively, as shown in FIG. 4. In detail, each of the initial cylindrical electrodes 35a comprises an initial upper section 36a and an initial lower section 37a. The illustrated initial upper section 36a is surrounded by the silicon nitride film 32 and the insulator film 33, while the illustrated initial lower section 37a is surrounded by the silicon nitride film 30 and the insulator film 31.

Then, specific impurities are implanted into the inner surfaces of the initial upper sections, as shown in FIG. 4. The specific impurities are elements serving to prevent the initial upper section 36a from being roughened. If the impurities doped into the source regions 16 are of n-type, it is preferable that the specific impurities are of n-type such as phosphorus or arsenic (As) elements. If the impurities doped into the source regions 16 are of p-type, it is preferable that the specific impurities are of p-type. In addition, if the initial cylindrical electrodes 35a of amorphous silicon have several tens nm, it is preferable that dose amounts of phosphorus elements is $1 \times 10^{14}/cm^2$. In this embodiment, the specific impurities are phosphorus (P) elements, and the concentration of the implanted phosphorus elements is $4 \times 10^{20}/cm^3$.

The implanting direction of the specific impurities is a direction oblique to the vertical direction. The oblique angle of the implanting direction is determined so that the specific impurities are implanted into the initial upper section 36a but are not substantially implanted into the initial lower section 37a. For example, if the initial cylindrical electrode 35a has an inner diameter of 100 to 200 nm, it is preferable that the oblique angle of the implanting direction falls in a rage of 3.8° to 7.6°. As the result, the initial upper section 36a includes more phosphorus elements in comparison with the initial lower section 37a. In addition, it is preferable that the number of the implanting directions is four. Furthermore, resists may be formed only on the initial lower sections 37a of the initial cylindrical electrodes 35a to prevent the specific impurities from being implanted into the initial lower sections 37a.

Figure 5:
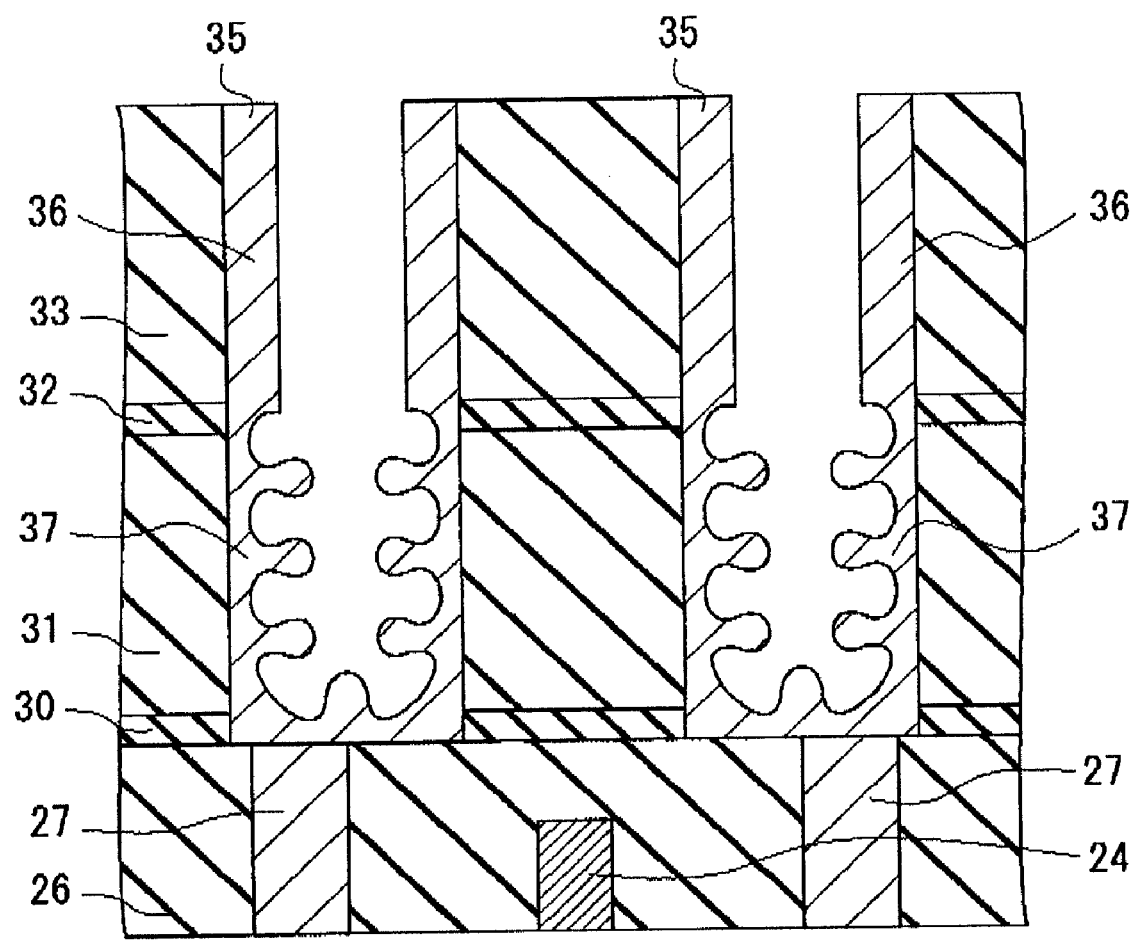
FIG. 5 is a cross-sectional view schematically showing a subsequent fabrication process for the semiconductor device of FIG. 1.

Next, the initial cylindrical electrodes 35a are exposed to a roughening process so that cylindrical electrodes 35 are obtained as shown in FIG. 5. In this embodiment, the roughening process is a heat treatment process, and the cylindrical electrodes 35 are made of amorphous silicon. Normally, amorphous silicon film is hemispherical grained through a heat treatment process. However, doped phosphorus elements prevent the formation of the hemispherical grains (HSG). Therefore, in this embodiment, the hemispherical grains (HSG) are substantially formed only on the lower sections 37 of the cylindrical electrodes 35 through the heat treatment process. In detail, as apparent from FIGS. 4 and 5, the initial lower sections 37a are hemispherical grained to be the lower sections 37, each of which has a roughened inner surface. On the other hand, the initial upper sections 36a are not substantially hemispherical grained to be the upper sections 36, each of which has a not-roughened inner surface.

Figure 6:
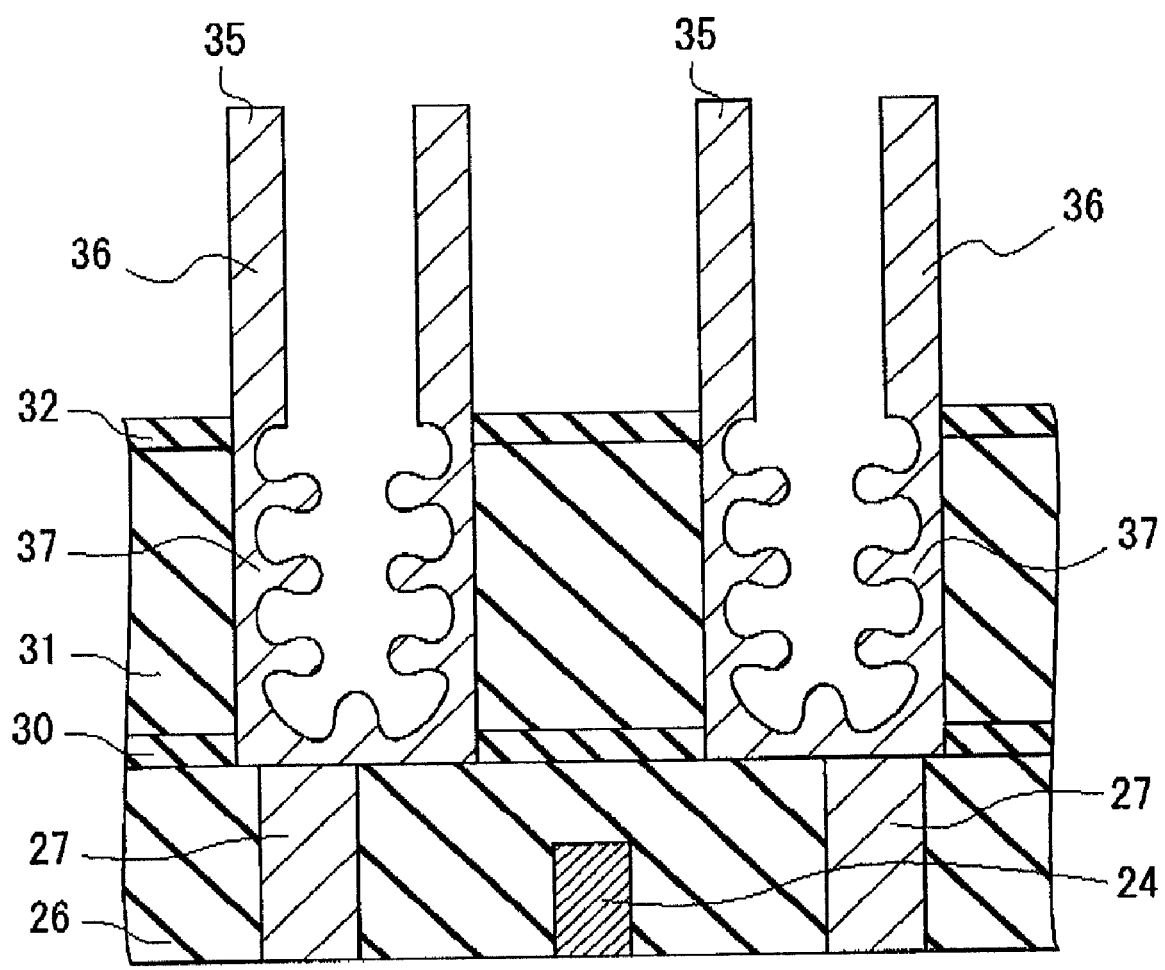
FIG. 6 is a cross-sectional view schematically showing a subsequent fabrication process for the semiconductor device of FIG. 1.

With reference to FIG. 6, the insulator film 33 is removed by a wet etching process so that the lower sections 37 of the cylindrical electrodes 35 are supported by the silicon nitride film 30, the insulator film 31 and the silicon nitride film 32. The silicon nitride film 30, the insulator film 31 and the silicon nitride film 32 serve as a support insulator that supports the outer surfaces of the lower sections 37. On the other hand, the upper sections 36 project upwardly from the silicon nitride film 32; the upper sections 37 have exposed outer surfaces.

Figure 7:
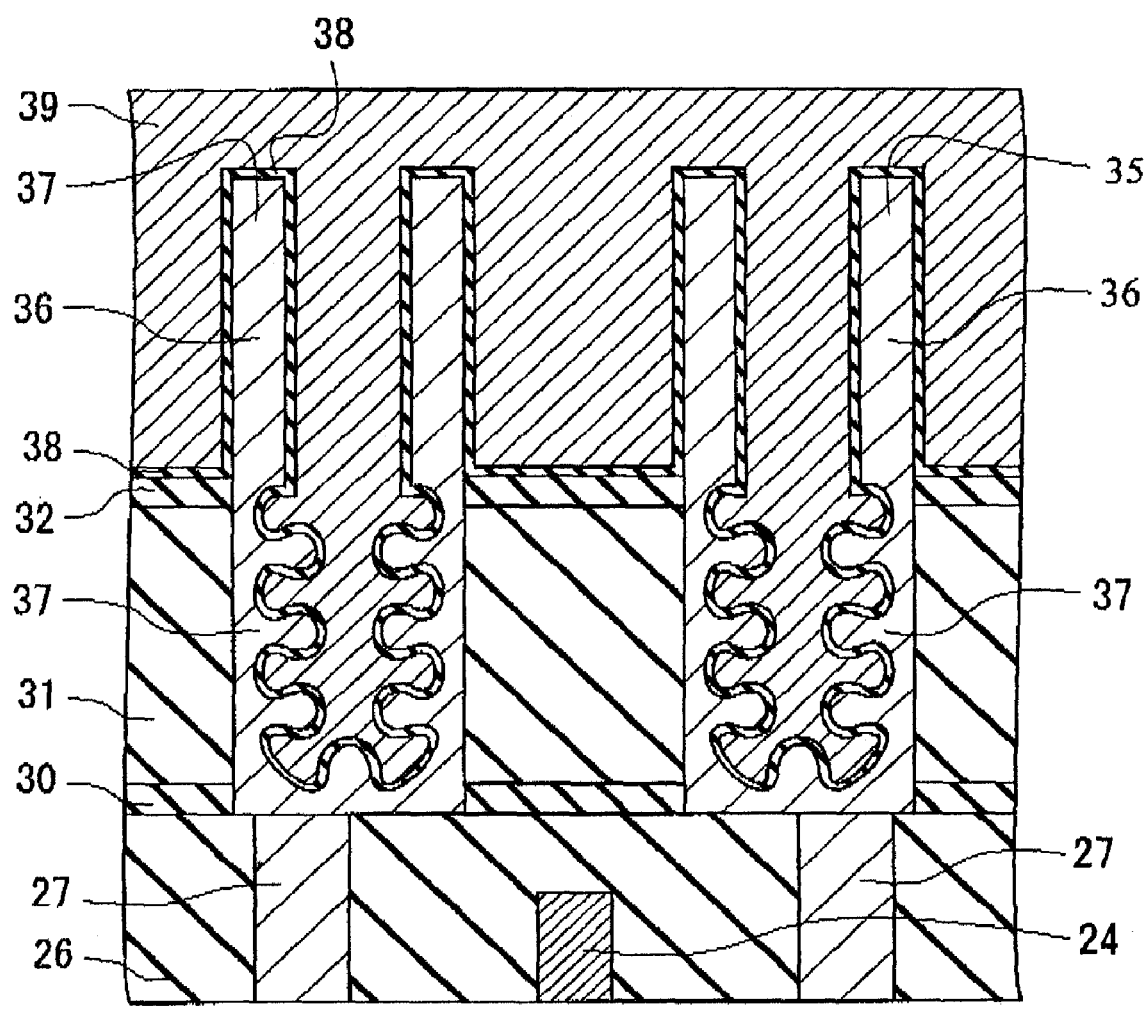
FIG. 7 is a cross-sectional view schematically showing a subsequent fabrication process for the semiconductor device of FIG. 1.

With reference to FIG. 7, a dielectric film 38 is formed to cover the whole upper sections 36 and the inner surfaces of the lower sections 37. In this embodiment, the dielectric film 38 is made of AlO, and the dielectric film formation is carried out through an atomic layer deposition (ALD) method. The formed dielectric film 38 has a thickness of 2 nm. Then, a titanium nitride (TiN) film is deposited at 500 C.° to have a thickness of 20 nm or more so that an upper electrode 39 is formed on the dielectric film 38. The cylindrical electrodes 35, the dielectric film 38 and the upper electrode 39 constitute capacitors of memory cells. In other words, the cylindrical electrodes 35 serve as lower electrodes of the capacitors.

Then, still another insulator layer 40 is formed on the upper electrode 39, as shown in FIG. 1. Furthermore, on the insulator layer 40, lines 41 are formed. Then, various elements necessary for DRAM are formed in this embodiment.

Figure 8:
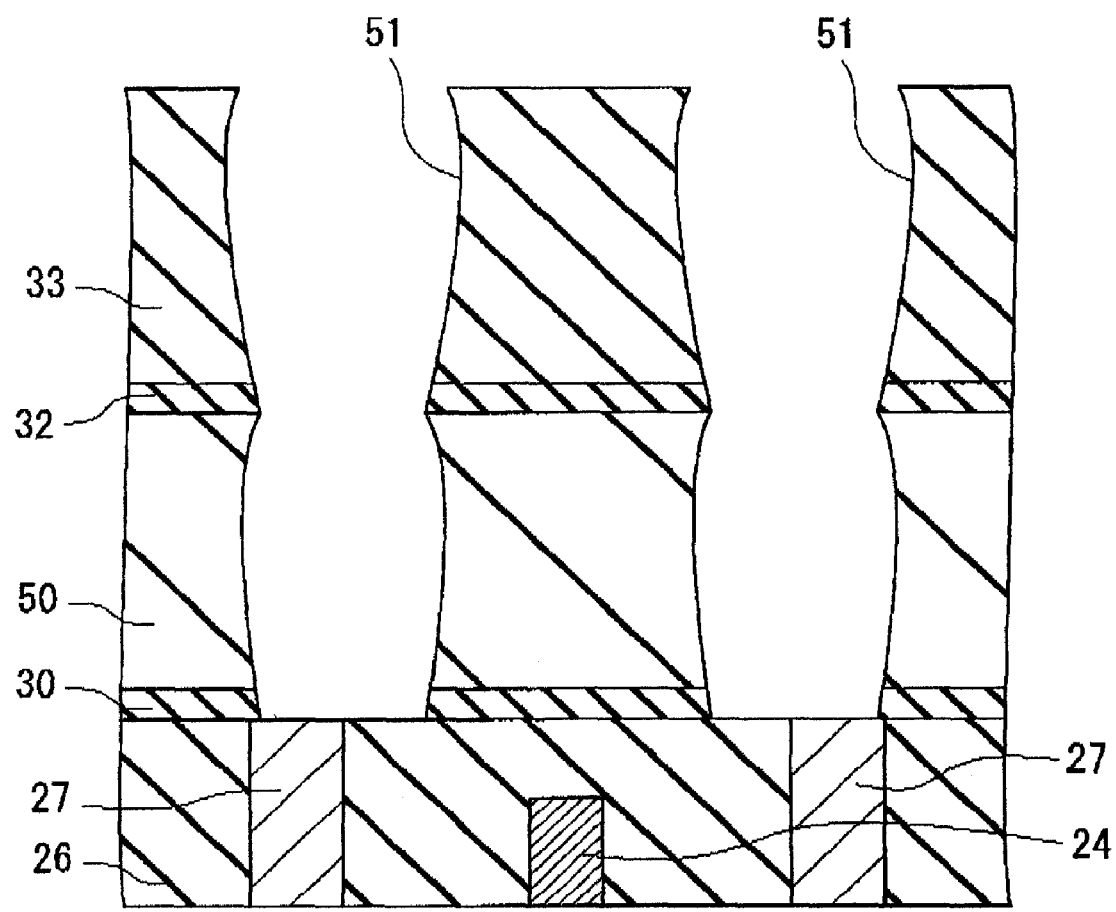
FIG. 8 is a cross-sectional view schematically showing a subsequent fabrication process for the semiconductor device of FIG. 1.

Various modifications may be applied to the above-mentioned embodiment. Although the insulator film 31 and the insulator film 33 are formed of the same material, i.e. NSG, the present invention is not limited thereto. For example, the insulator film 31 may be formed of another material different from that of the insulator film 33. In detail, if the hole formation etching is carried out by using a specific etchant and if the insulator layer 31 has a first etching rate with respect to the specific etchant, the insulator layer 33 may have a second etching rate smaller than the first etching rate with respect to the specific etchant. Specifically, the insulator layer 31 may be formed of boron phosphorous silicon glass (BPSG), while the insulator layer 33 be formed of NSG, wherein BPSG has an etching rate that is some five times larger than another etching rate of NSG As shown in FIG. 8, different etching rates of the insulator layers 31, 33 result in that each of holes 51 has a shape more similar to an ideal cylindrical shape.

Figure 9:
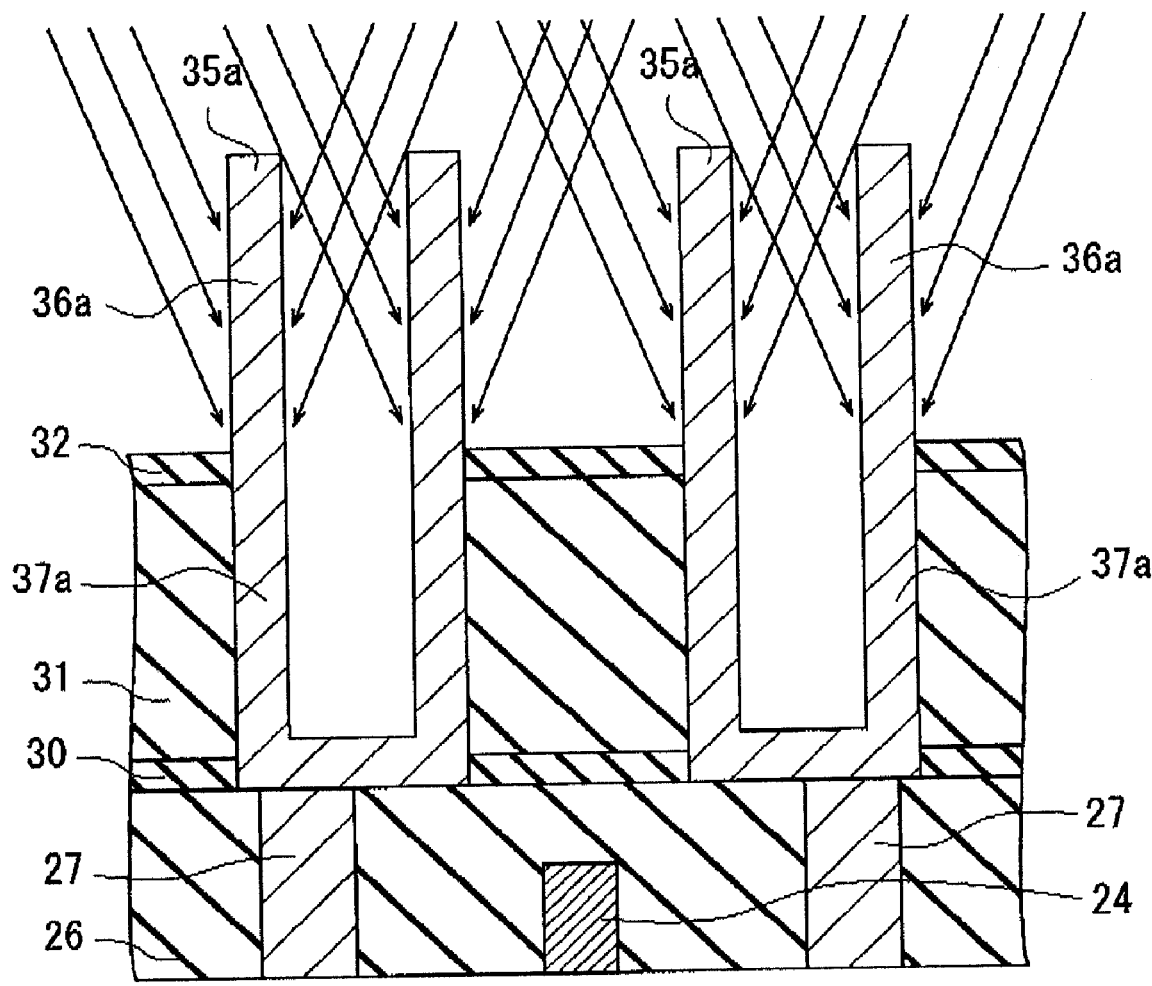
FIG. 9 is a cross-sectional view schematically showing another fabrication process for the semiconductor device of FIG. 1.

Although the implanting of the specific impurities are carried out before the removal of the insulator layer 33 in this embodiment, the present invention is not limited thereto. For example, as shown in FIG. 9, the implanting of the specific impurities may be carried out after the removal of the insulator layer 33. In this case, the specific impurities, phosphorous elements in this embodiment, are implanted into not only the inner surfaces of the initial upper sections 36a but also the outer surfaces of the initial upper sections 36a.

In addition, metal films may be formed between the cylindrical electrodes 35 and the dielectric film 38 so that the metal films directly cover the surfaces of the cylindrical electrodes 35. The metal film may partially cover the cylindrical electrode. The cover metal films suppress formation of oxidation films on the surfaces of the cylindrical electrodes 35. The suppression of the oxidation film formation effects on heightened capacitances of the capacitors. Preferably, the thickness of the metal film falls in a range of 5 to 10 nm. The metal films may be formed just after the roughening process as shown in FIG. 5; in this case, the metal films are formed only on the inner surfaces of the cylindrical electrodes 35. The metal films may be formed after the removal of the insulator layer 33 as shown in FIG. 6; in this case, the metal films are formed not only on the inner surfaces of the cylindrical electrodes 35 but also on the outer surfaces of the upper sections 36. Specifically, in the latter case, it is preferable that tungsten (W) films are selectively formed only on the surfaces of the cylindrical electrodes 35 through a chemical vapor deposition (CVD) process under an atmosphere including $WF_6$ and $H_2$. The selective formation of the tungsten films prevents the capacitors from being short-circuited with each other.

Figure 10:
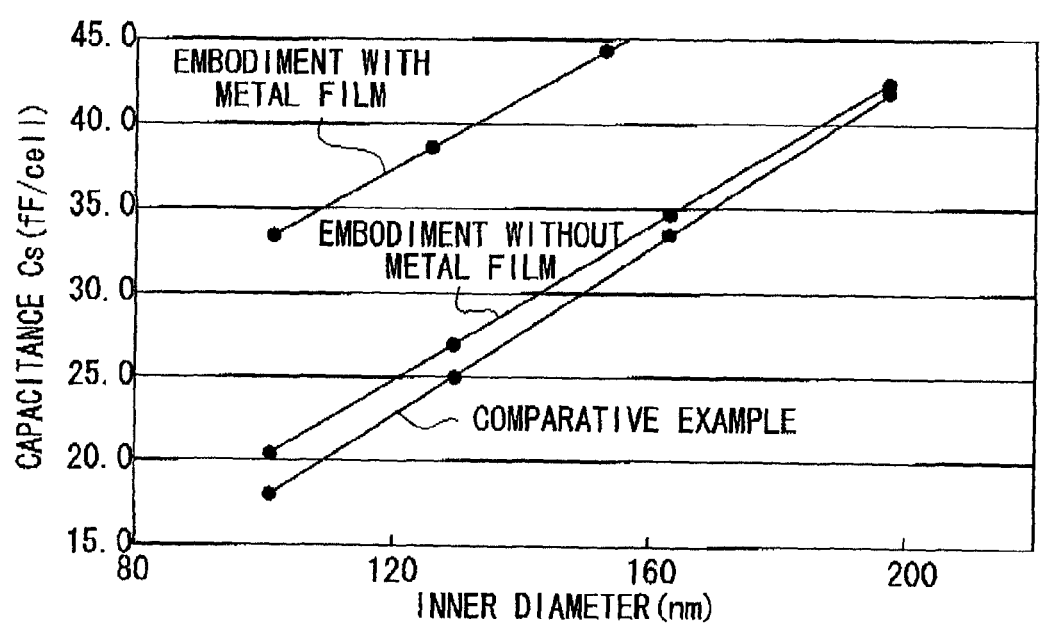
FIG. 10 is a graph showing a relation between a capacitance of a capacitor and an inner diameter of a hole that is formed during the formation of a lower electrode of the capacitor.

FIG. 10 is a graph showing a relation between a capacitance Cs of a capacitor and an inner diameter of a hole 34 that is formed during the formation of a cylindrical electrode 35 of the capacitor. In the graph, the following three examples are shown: an example in accordance with the above-mentioned embodiment with a metal film formed between the cylindrical electrode 35 and the dielectric film 38; an example in accordance with the above-mentioned embodiment without a metal film between the cylindrical electrode 35 and the dielectric film 38; and a comparative example in which hemispherical grains are formed over the entire of the cylindrical electrode. According to the above-mentioned embodiment, the capacitor has a large capacitance in comparison with the comparative example even in the smaller inner diameter of the hole 34. In addition, the formation of the metal film between the cylindrical electrode 35 and the dielectric film 38 results in heightening the capacitance of the capacitor.

The present application is based on a Japanese patent application of JP2007-005944 filed before the Japan Patent Office on Jan. 15, 2007, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method for fabricating a semiconductor device, the semiconductor device including a capacitor and a support insulator, the capacitor including a cylindrical electrode, the cylindrical electrode extending in a vertical direction, the method comprising:

forming the cylindrical electrode, the cylindrical electrode comprising upper and lower sections, the lower section having a supported outer surface supported by the support insulator and a roughened inner surface, the upper section upwardly projecting from the support insulator and having an exposed outer surface, the forming of the cylindrical electrode comprising:

forming an initial cylindrical electrode supported by the support insulator, the initial cylindrical electrode comprising an initial upper section and an initial lower section, the initial upper section and the initial lower section corresponding to the upper section and the lower section of the cylindrical electrode, respectively, the initial upper section being supported by the support insulator;

implanting specific impurities into the initial upper section, the specific impurities serving to prevent the initial upper section from being roughened;

exposing the initial cylindrical electrode to a roughening process so that the initial lower section is roughened to be the lower section, forming a first insulator;

forming a second insulator on the first insulator;

etching the first and the second insulators to form a hole that extends in the first and the second insulators along the vertical direction and has an inner surface, wherein the forming of the initial cylindrical electrode is carried out so that the initial cylindrical electrode is formed on the inner surface of the hole, while etched first insulator constitutes the support insulator; and removing the second insulator before the implanting, and the implanting is carried out so that the specific impurities are implanted into outer and inner surfaces of the initial upper section along a direction oblique to the vertical direction.

2. The method to claim 1 wherein the etching is carried out by using a specific etchant, the first insulator having a first etching rate with respect to the specific etchant, and the second insulator having a second etching rate smaller than the first etching rate with respect to the specific etchant.

3. The method according to claim 1 further comprising forming a film that covers, at least in part, the cylindrical electrode, the film comprising metal elements.

4. The method according to claim 1 wherein:

the forming of the initial cylindrical electrode is carried out so that the initial cylindrical electrode is made of amorphous silicon;

the implanting is carried out so that phosphorus elements are implanted as the specific impurities into the initial upper section; and the exposing is carried out so that the initial lower section is hemispherical grained.

* * * * *